(12) United States Patent
Schwarz et al.

(10) Patent No.: US 8,575,951 B2
(45) Date of Patent: Nov. 5, 2013

(54) METHOD FOR TESTING MULTIPLE COUPONS

(75) Inventors: Yoram Schwarz, Santa Clara, CA (US); Ryan Clarke, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 412 days.

(21) Appl. No.: 13/112,615

(22) Filed: May 20, 2011

(65) Prior Publication Data

US 2012/0293162 A1    Nov. 22, 2012

(51) Int. Cl.
*G01R 31/00*    (2006.01)

(52) U.S. Cl.
USPC .................................. 324/750.16; 324/754.1

(58) Field of Classification Search
None
See application file for complete search history.

(56) References Cited

U.S. PATENT DOCUMENTS

| | | | | |
|---|---|---|---|---|
| 4,500,836 | A * | 2/1985 | Staudacher | 324/73.1 |
| 7,034,563 | B1 * | 4/2006 | Souchkov et al. | 324/750.23 |

* cited by examiner

*Primary Examiner* — Minh N Tang

(57) ABSTRACT

A method for testing multiple coupons is described. The x, y, and theta offset coordinates of a reference structure for each coupon are determined. Additionally, the x and y offset coordinates between the reference structure and the first test device are determined. After the reference data from all of the coupons have been determined, the testing sequence for all of the coupons can be initiated and completed without further intervention.

6 Claims, 4 Drawing Sheets

METHOD FOR TESTING MULTIPLE COUPONS

FIELD OF THE INVENTION

The present invention relates generally to systems and methods for the parallel, high throughput electrical testing of multiple coupons in an R&D environment.

BACKGROUND OF THE INVENTION

The manufacture of integrated circuits (IC), semiconductor devices, flat panel displays, optoelectronics devices, data storage devices, magneto-electronic devices, magneto-optic devices, packaged devices, and the like entails the integration and sequencing of many unit processing steps. As an example, IC manufacturing typically includes a series of processing steps such as cleaning, surface preparation, deposition, lithography, patterning, etching, planarization, implantation, thermal annealing, and other related unit processing steps. The precise sequencing and integration of the unit processing steps enables the formation of functional devices meeting desired performance metrics such as speed, power consumption, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, and U.S. Pat. No. 7,902,063 filed on Feb. 10, 2006 which are all herein incorporated by reference.

Typically, during the discovery, optimization and qualification of each unit process, it is desirable to utilize sample material in an efficient manner. Therefore, it is common to divide substrate material into smaller units known as coupons. As used herein, coupon will be understood to mean a smaller section of a substrate. The coupon will be understood to have all of the properties and functionality as the substrate. For example, if the substrate is a semiconductor wafer with a plurality of devices thereon, then a coupon is understood to be a section of the wafer and each coupon is understood to also contain a plurality of devices.

In an R&D environment, the coupons are generally tested individually at a probe station to determine the electrical properties of the materials or the performance of the devices. Since the coupons are non-standard sections of the wafer, the testing requires manual set-up and calibration at the probe station. Once the reference coordinates of the coupon have been determined and a relative offset to the test pads of the target devices, the probe station can usually complete the testing of all of the devices or test regions of the coupon automatically. However, this set-up procedure must be repeated for each coupon.

The electrical tests for a typical coupon can vary in time and can range from a few minutes to many hours depending on the number of devices, the number of tests to be performed, etc. This requires that a technician be available when the testing of one coupon is completed so that the next coupon can be mounted, calibrated, and the testing initiated. Since the test time varies, it is common for the probe station to be idle and waiting for the technician to start the sequence for the next coupon. Alternatively, it is common for the technician to be idle and waiting for the probe station to complete the testing so that the sequence for the next coupon can be started. In both cases, valuable resources are being used in a sub-optimal manner leading to increased costs and longer development times.

Therefore, there is a need to develop methods for testing multiple coupons that increases the utilization of the probe station resources and increases the utilization of the technician's time. There is a need for methods that allow the probe station to operate autonomously after a set-up and calibration procedure so that technician intervention is not required.

SUMMARY OF THE INVENTION

In some embodiments, multiple coupons are loaded onto a vacuum chuck and the x, y, and theta coordinates of the reference point of each coupon are determined. Additionally, the x, and y offset coordinates from the reference point to the target test region of each coupon is determined. The probe station then tests all of the devices on all of the coupons and transfers the test data to a central database before requiring intervention by the technician.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example.

The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
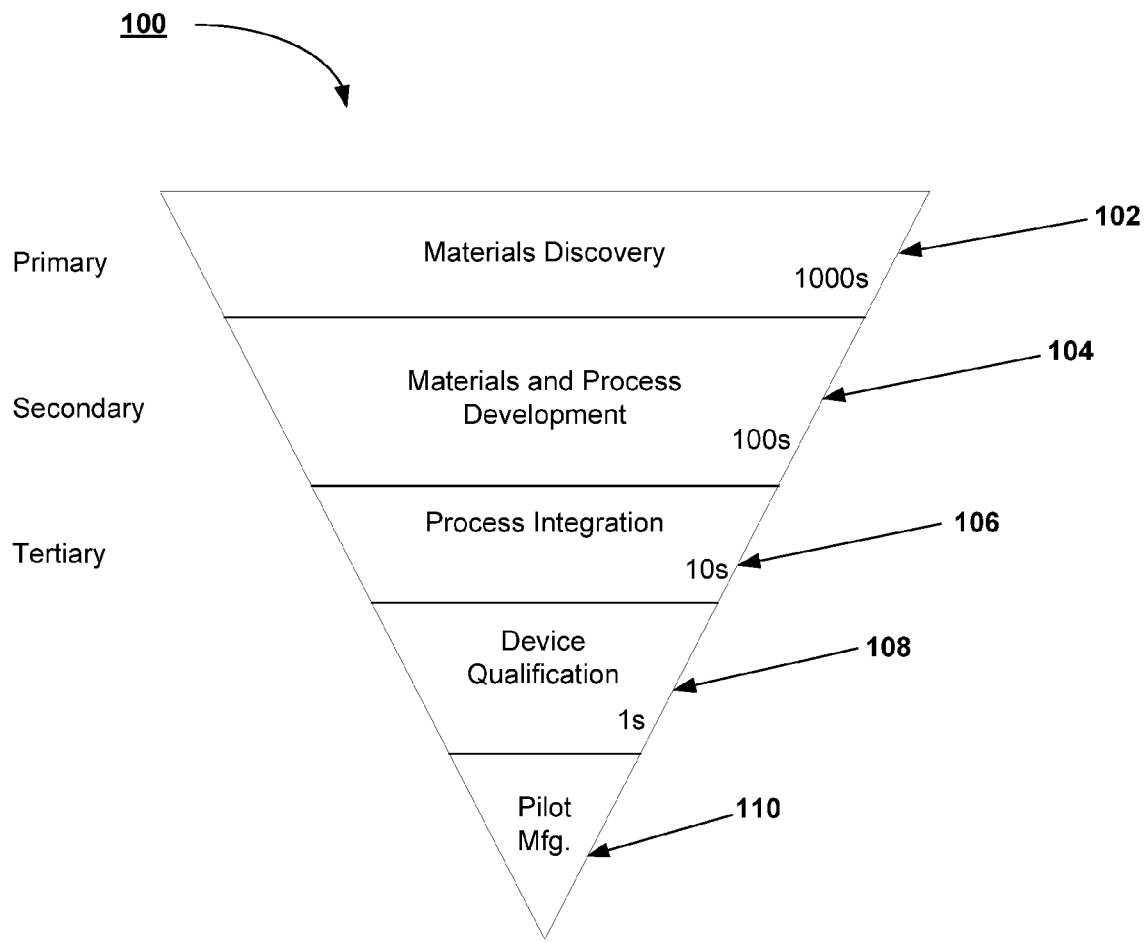
FIG. 1 is a schematic diagram for implementing combinatorial processing and evaluation.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing wafers into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full wafers within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

At each stage of the development and screening of new materials and/or processes, the various regions of the substrates must be tested, analyzed, and evaluated. A wide variety of analytical tools and methods may be employed depending on the material property that is being tested. One important class of material properties is the electrical characteristics of the material. Examples of some properties that can be evaluated include current versus voltage (I/V) behavior for dielectric materials, capacitance (C) behavior for dielectric materials, time dependent dielectric breakdown (TDDB) behavior for dielectric materials, sheet resistance for conductive materials, resistance change and state for resistive random access memory (ReRAM) materials, etc.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes and process sequence used to build that portion of the device or structure. During the processing of some embodiments described herein, structures are formed on the processed semiconductor substrate that are equivalent to the structures formed during actual production of the semiconductor device. For example, such structures may include, but would not be limited to, trenches, vias, interconnect lines, capping layers, masking layers, diodes, memory elements, gate stacks, transistors, or any other series of layers or unit processes that create an intermediate structure found on semiconductor chips. While the combinatorial processing varies certain materials, unit processes, or process sequences, the composition or thickness of the layers or structures or the action of the unit process, such as cleaning, surface preparation, etch, deposition, planarization, implantation, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
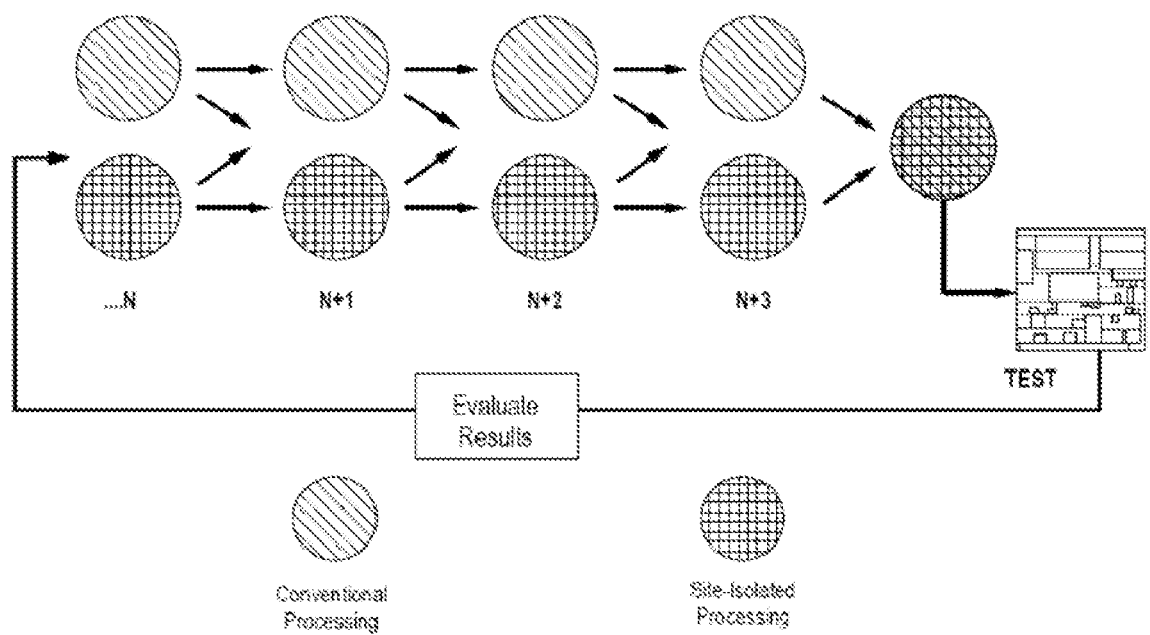
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, e.g. wafers as shown or portions of monolithic substrates such as coupons or wafer coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. It should be appreciated that these process parameters are exemplary and not meant to be an exhaustive list as other process parameters commonly used in semiconductor manufacturing may be varied.

As mentioned above, within a region the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
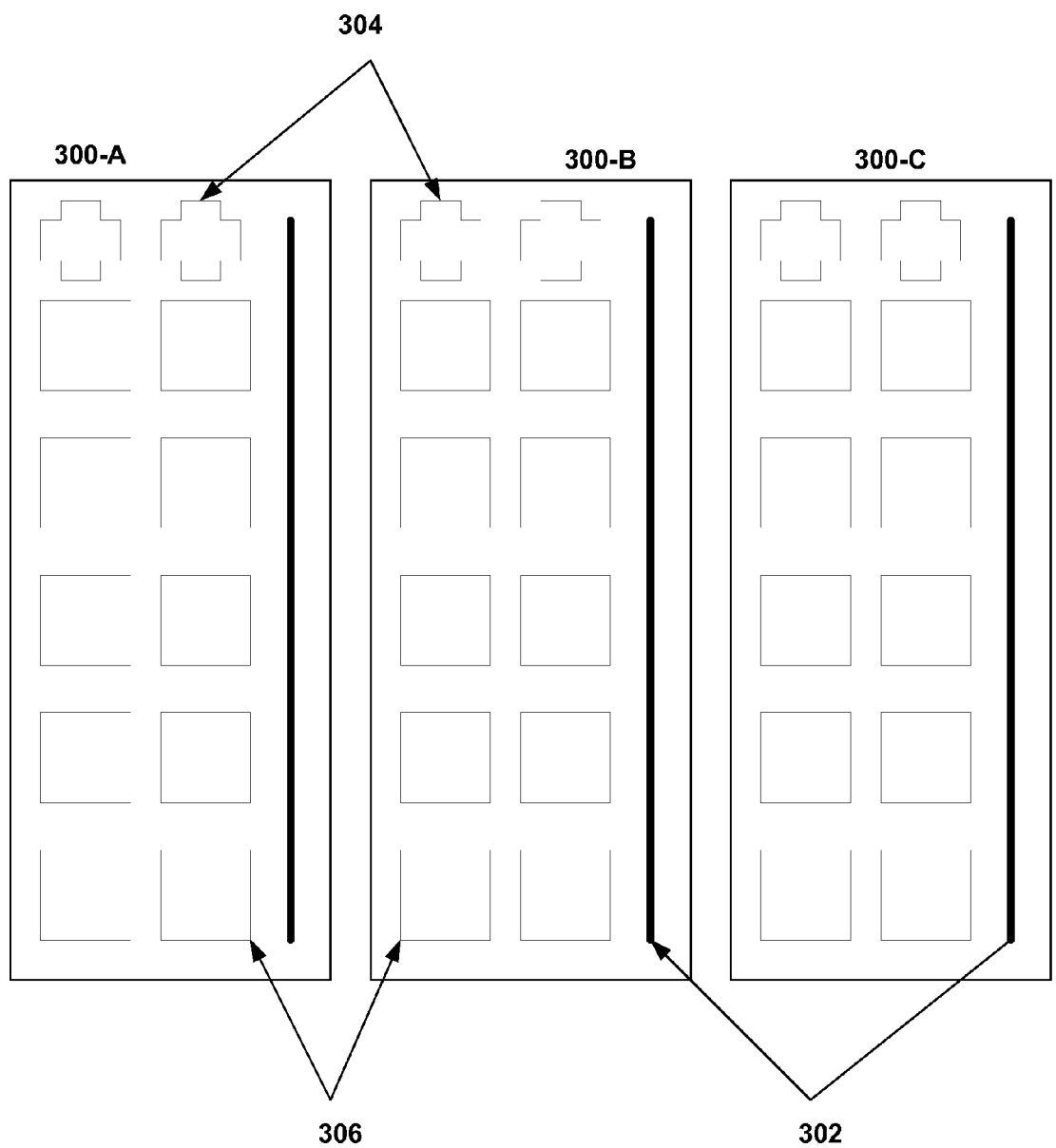
FIG. 3 is a schematic diagram of multiple coupons, each coupon with a theta reference line, a structure that serves as a reference point, and multiple test devices.

In an R&D environment, each of the regions of the substrate must be tested, analyzed, and evaluated so that promising material or process candidates may be selected for the next phase of the screening. In the case of testing electrical characteristics, this is typically accomplished using an electrical testing probe station and associated data collection network. Typically, probe stations contain a sample stage that can be manipulated in the x, y, and z orthogonal directions. Advantageously, the stage can be manipulated automatically using servo motors under the control of a computer system. This obviates the need to have a technician manually manipulate the sample stage to move to each of the test regions. Typically, electrical probe stations have two probe assemblies each probe assembly comprising two probe tips that contact the samples at the test sites. The probe assemblies are electrically connected to an instrument cluster. Depending on the nature of the electrical test, the instrument cluster may contain hardware such as power supplies, current sources, voltage sources, waveform generators, digital multimeters, device analyzers, a switch matrix, etc. Advantageously, the instrument cluster can be interfaced to a computer to allow for automatic test signal generation and automatic data collection during the test sequences. The present invention may further take advantage of parallel testing methodologies further described in U.S. application Ser. No. 13/104,742 filed on May 10, 2011, entitled "METHOD AND APPARATUS FOR PARALLEL TESTING OF SEMICONDUCTOR DEVICES" and is incorporated herein by reference FIG. 3 is a schematic diagram of multiple coupons, each coupon with a theta reference line, a structure that serves as a reference point, and multiple test devices. Advantageously, the test devices and/or the coupons have been processed in a high productivity combinatorial manner to deposit a material to be tested on different test devices and/or different coupons.

The schematic is for illustrative purposes only and is not to scale. FIG. 3 illustrates three coupons, 300-A, 300-B, 300-C, that are to be tested. Clearly, the actual number of coupons can vary. The coupons are shown with a vertical orientation, but can also be arranged in a horizontal orientation. Typically, there is a structure on the coupon that allows the technician to determine an angle, theta, deviation from one of the x or y orthogonal axes. In FIG. 3, this feature is illustrated as line, 302. Typically this is a street between the devices, the edge of a large feature, a drawn alignment feature, etc. The technician will align this feature with the reference mark on the probe station optical system and record the angle of deviation, theta. Each coupon also comprises at least one reference structure, 304. These structures serve as reference points from which the distance and coordinates of all of the test structures on the coupon are known. In FIG. 3, each coupon has been depicted with two reference structures, 304. Finally, each coupon comprises at least one test device, 306. In FIG. 3, each coupon has been depicted with ten test devices, 306.

Figure 4:
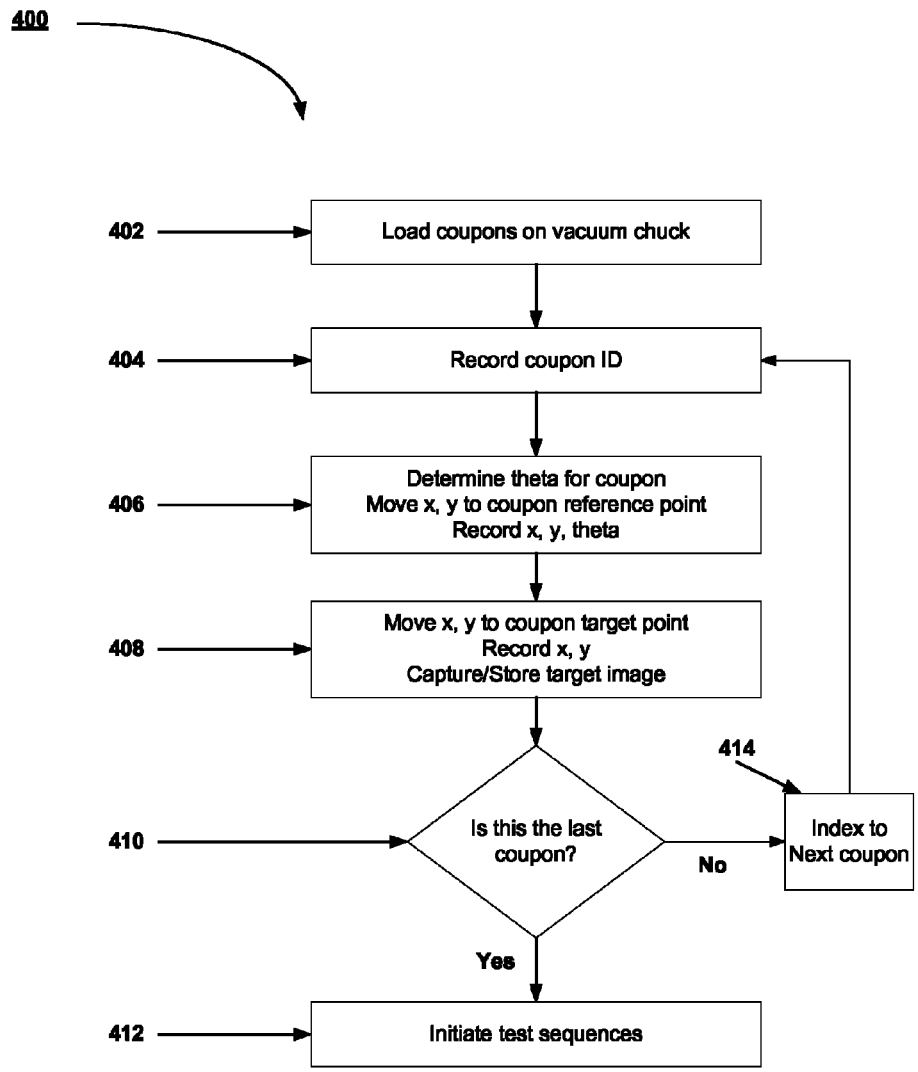
FIG. 4 is a flow chart in accordance with some embodiments of the present invention.

FIG. 4 is a flow chart, 400, in accordance with some embodiments of the present invention. In step 402, the coupons are loaded onto the vacuum chuck of the probe station. Each coupon must engage with at least one vacuum port so that it does not move during the testing sequence. At this point, the technician generally tries to generally align the theta deviation structure, 302, with one of the x or y orthogonal axes. In step 404, the technician reads and records the identification (ID) of each coupon and this data is loaded into the central database. This step can be accomplished manually by the technician or can be accomplished automatically using techniques such as bar code readers, optical character readers (OCR), radio frequency identification (RFID) tags, etc. In step 406, the technician aligns the theta deviation structure, 302, with the reference mark on the probe station optical system and records the angle of deviation, theta. The technician also aligns the probe tips with a reference structure, 304, and records the x and y coordinates. The x and y reference coordinates and the theta offset can be manually entered into the database or, most commonly, are communicated to the database automatically by the probe station. In step 408, the technician then moves the probe station so that the probe tips are aligned with test sites of the first device to be tested. As discussed before, these x and y coordinates are recorded and communicated to the database. Additionally, in step 408, the target image of the test sites of the device are captured and stored in the optical system as a reference. Typically, the probe stations comprise an advanced optical (AO) comparator system that can be used to ensure that the probe tips are properly aligned following a movement or indexing of the sample stage. The AO comparator system can compare the current view under the probe tips with the stored image and decide to proceed with the test or generate an error based on predetermined alignment criteria. In step 410, if the current coupon being aligned is the last coupon to be tested, the technician proceeds to the testing phase in step 412. However, if the current coupon being aligned is not the last coupon to be tested, the technician proceeds to index to the next coupon at step 414 and goes back to step 404 for the next coupon. This sequence is repeated until all of the coupons have been properly referenced. Once all of the coupons have been properly referenced, the test sequences may be initiated in step 412 and the probe station will proceed to complete all of the tests required on all of the devices on all of the coupons autonomously.

The method illustrated in FIG. 4 has several advantages. It improves the efficiency of the probe station since the probe station is allowed to test multiple coupons without waiting for the technician to intervene between each individual coupon test. The probe station generally operates autonomously and transmits the test data to the database automatically for each test. The probe station may perform multiple types of tests on each test device on each coupon. The probe station may also perform multiple types of tests on each coupon and may perform different tests for each coupon. The testing procedure and testing sequence for each coupon is generally coordinated by a master controller that is interfaced with the probe station and communicates with the central database.

The method outlined in FIG. 4 also improves the efficiency of the technician since once the reference coordinates for all of the coupons have been determined and the test sequences initiated, the technician may attend to other duties without the frequent interventions required in a single coupon test scenario.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for testing multiple coupons comprising:
   a. loading more than one coupon on a vacuum chuck associated with a probe station, wherein the probe station has associated therewith an instrument cluster, wherein the instrument cluster comprises one or more hardware modules that operate to test an electrical property of a material formed on multiple test devices of each coupon in a high productivity combinatorial manner;
   b. aligning each coupon by the steps of:
      i. determining the unique identification of a coupon and entering the unique identification of the coupon into a data storage medium;
      ii. aligning a theta deviation structure with a reference mark on the probe station to determine a deviation angle, theta;
      iii. aligning probe tips of the probe station with a reference structure on the coupon and determining the x and y coordinates of the reference structure;
      iv. entering the deviation angle, theta, and the x and y coordinates of the reference structure into the data storage medium wherein the deviation angle, theta, and the x and y coordinates are associated with the unique identification of the coupon;
      v. aligning probe tips of the probe station with a test structure on the coupon and determining the x and y coordinates of the test structure;
      vi. entering the x and y coordinates of the test structure into the data storage medium wherein the x and y coordinates are associated with the unique identification of the coupon;
   c. repeating steps i)-vi) until all of the coupons have been aligned; and
   d. initiating a sequence of tests of the coupons after the last coupon has been aligned.

2. The method of claim 1 wherein the probe assembly and associated instrument cluster tests the same electrical property of the material on each test device.

3. The method of claim 1 wherein the probe assembly and associated instrument cluster tests the same electrical property of the material on each coupon.

4. The method of claim 1 wherein the probe assembly and associated instrument cluster tests a different electrical property of the material on each test device.

5. The method of claim 1 wherein the probe assembly and associated instrument cluster tests a different electrical property of the material on each coupon.

6. The method of claim 1 further comprising using an advanced optical comparator system to ensure that the probe tips are properly aligned following a movement or indexing of the vacuum chuck.

* * * * *